(12) United States Patent
Vestyck

(10) Patent No.: US 10,161,567 B2
(45) Date of Patent: Dec. 25, 2018

(54) PROCESS CHAMBER PRESSURE CONTROL SYSTEM AND METHOD

(75) Inventor: Daniel J. Vestyck, Allentown, PA (US)

(73) Assignee: SPTS Technologies Limited, Newport (GB)

( * ) Notice: Subject to any disclaimer, the term of this patent is extended or adjusted under 35 U.S.C. 154(b) by 348 days.

(21) Appl. No.: 13/809,610

(22) PCT Filed: Jul. 14, 2010

(86) PCT No.: PCT/US2010/041906
§ 371 (c)(1),
(2), (4) Date: Feb. 25, 2013

(87) PCT Pub. No.: WO2012/008954
PCT Pub. Date: Jan. 19, 2012

(65) Prior Publication Data
US 2013/0153045 A1  Jun. 20, 2013

(51) Int. Cl.
*F17C 13/00* (2006.01)
*C23C 16/455* (2006.01)
*H01L 21/67* (2006.01)
*H01L 21/311* (2006.01)

(52) U.S. Cl.
CPC ...... *F17C 13/002* (2013.01); *C23C 16/45557* (2013.01); *H01L 21/31116* (2013.01); *H01L 21/67017* (2013.01); *H01L 21/67253* (2013.01); *Y10T 137/0396* (2015.04); *Y10T 137/86002* (2015.04)

(58) Field of Classification Search
CPC ............. F17C 13/002; H01L 21/67017; H01L 21/31116; H01L 21/67253; Y10T 137/0396; Y10T 137/86002

USPC .......................................................... 700/282
See application file for complete search history.

(56) References Cited

U.S. PATENT DOCUMENTS

| 5,922,219 A | 7/1999 | Fayfield et al. |
| 6,013,418 A * | 1/2000 | Ma et al. ................. 430/323 |
| 2002/0025684 A1* | 2/2002 | Butterbaugh et al. ......... 438/712 |
| 2002/0052120 A1* | 5/2002 | Shintani ................. C09K 13/08 438/734 |
| 2003/0015764 A1* | 1/2003 | Raaijmakers et al. ........ 257/424 |

(Continued)

FOREIGN PATENT DOCUMENTS

| JP | 1988-238281 | 10/1988 |
| JP | 2007-231406 | 9/2007 |

OTHER PUBLICATIONS

International Search Report dated Feb. 25, 2011 from International Patent Application No. PCT/US2010/041906.

(Continued)

*Primary Examiner* — Thomas C Lee
*Assistant Examiner* — Alan Chu
(74) *Attorney, Agent, or Firm* — Wolf, Greenfield & Sacks, P.C.

(57) ABSTRACT

A method of and apparatus for controlling pressure in a process chamber having a continuous gas inlet flow and a continuous gas outlet flow comprising providing a pulsed valve at a gas outlet, a pressure gauge, and a programmable controller and varying the pulse rate of the pulsed valve, wherein either the open time or closed time, or both open and closed times, is lengthened or shortened, depending on whether the gauge pressure is above or below the programmed setpoint.

15 Claims, 1 Drawing Sheet

(56) References Cited

U.S. PATENT DOCUMENTS

| | | | |
|---|---|---|---|
| 2004/0083961 A1* | 5/2004 | Basceri | C23C 16/45561 |
| | | | 118/715 |
| 2005/0081786 A1* | 4/2005 | Kubista | C23C 16/4412 |
| | | | 118/715 |
| 2006/0130744 A1* | 6/2006 | Clark | 117/86 |
| 2008/0006346 A1 | 1/2008 | Sato | |
| 2008/0041074 A1* | 2/2008 | Tarutani | 62/132 |
| 2009/0088000 A1* | 4/2009 | Reid | C23C 8/34 |
| | | | 438/773 |

OTHER PUBLICATIONS

International Preliminary Report on Patentability dated Nov. 16, 2012 from International Patent Application No. PCT/US2010/041906.

Office Action dated Mar. 16, 2016 from corresponding Korean Application No. 10-2013-7002002.

* cited by examiner

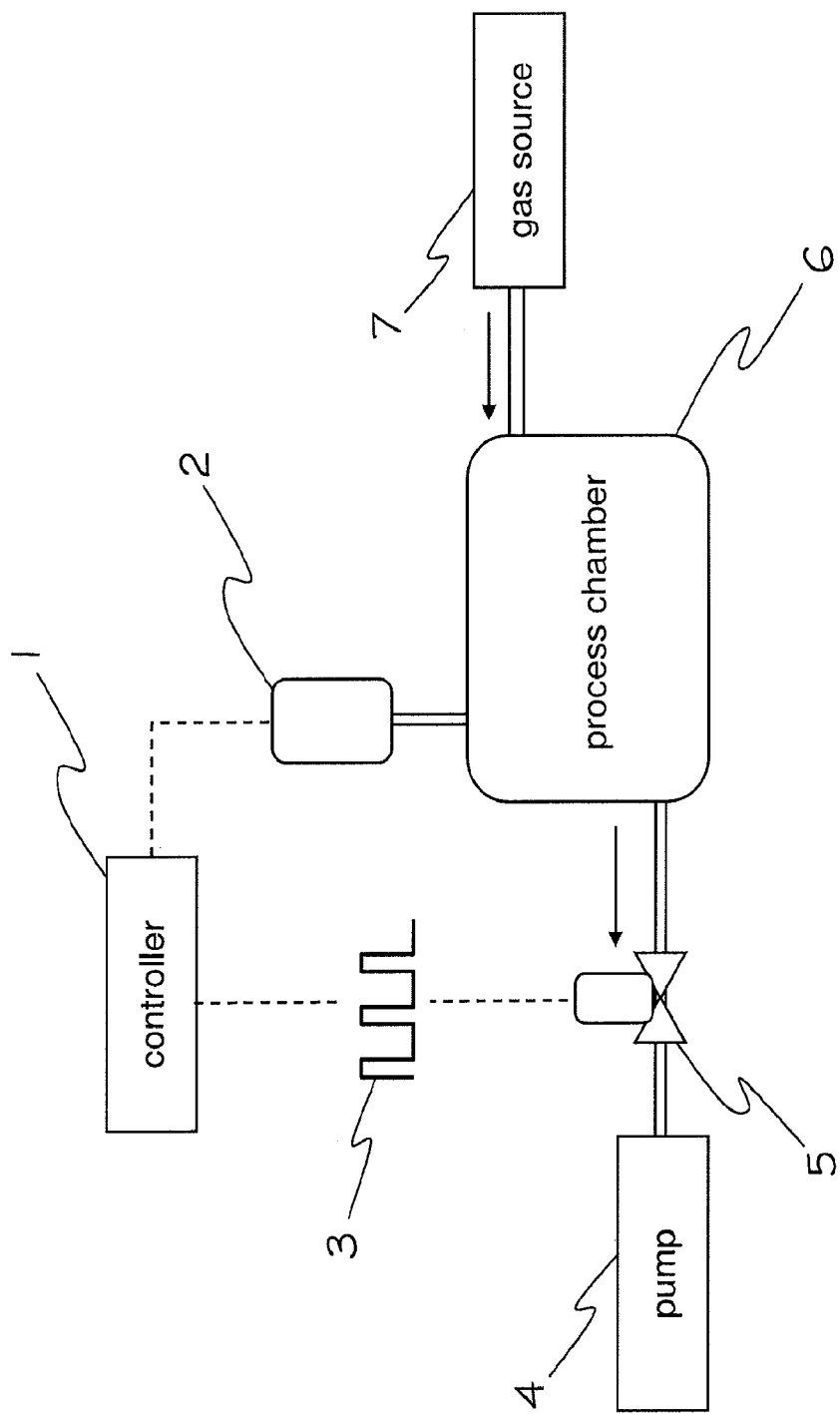

PROCESS CHAMBER PRESSURE CONTROL SYSTEM AND METHOD

BACKGROUND OF THE INVENTION

This invention relates to the field of process chamber pressure control. More particularly the invention relates to systems for and methods of carrying out processes which involve gases in a chamber in which pressure control is needed.

Pressure control for process chambers in various fields are known. For example, in the field of ion implantation devices with a closed-loop process chamber, pressure control systems are known such as the ones disclosed in U.S. Pat. No. 5,672,882 to Day, et al., assigned to Advanced Micro Devices, Inc. in which fluctuations in the pressure within the process chamber are reduced by additions of appropriate amounts of inert gas when the pressure sensed by the vacuum measurement unit drops below a predetermined pressure threshold value. In these prior systems a flow control valve which may be variably opened or closed in response to an electrical control signal, and which can deliver a variable amount of flow gas, is used. In U.S. Pat. No. 6,152,070 to Fairbairn, et al., assigned to Applied Materials, Inc., relating to the field of chemical vapor deposition ("CVD"), a tandem process chamber is disclosed wherein pressure within a processing chamber is controlled by a slit valve as disclosed by Tepman et al. in U.S. Pat. No. 5,226,632 and by Lorimer in U.S. Pat. No. 5,363,872.

In any process chamber of the type which includes a source of gas or vapor at a higher pressure than the exhaust or outlet pressure, which includes chambers which process at positive pressure or at a negative pressure, a valve is needed to maintain pressure close to or at a selected pressure. Prior systems use a variety of valves for this purpose, among which are the aforementioned slit valves and flow control valves, and butterfly valves, proportionally closing valves, needle valves, and the like. The prior valves are relatively expensive, are bulky, and have a large footprint which makes them unsuitable in certain applications. It is an object of the present invention to provide an improved pressure control system for process chambers which include a continuous gas inflow into the chamber and a continuous gas outflow from the chamber. It is also an object to provide an improved method of controlling pressure in a process chamber which includes continuously feeding gas through an inlet to the chamber and continuously removing gas from the chamber, which is free of the disadvantages of prior systems.

SUMMARY OF THE INVENTION

These objects, and others which will become apparent from the following disclosure and the drawings, are achieved by the present invention which comprises in one aspect a process chamber apparatus having an inlet for continuous gas inlet flow and an outlet for continuous gas outlet flow, a means for controlling process chamber pressure comprising a pressure gauge, a programmable logic controller, and a pulsed valve at, or in fluid communication with, the outlet, the pulsed valve having a controllable pulse rate, the controller programmed to process pressure data from the pressure gauge and to control the pulse rate of the pulsed valve to control the process chamber pressure. The valve can be at the exit port of the chamber or anywhere in the piping connecting the chamber to the pump.

In another aspect, the invention comprises a method of controlling pressure in a process chamber having a continuous gas inlet flow and a continuous gas outlet flow comprising providing a pulsed valve at, or in fluid communication with, a gas outlet, a pressure gauge, and a programmable controller and varying the pulse rate of the pulsed valve. Either the open time or close time of the pulsed valve can be adjusted longer or shorter by the controller, depending on whether an increase or decrease in pressure within the chamber is needed to adjust pressure to programmed pressure.

In some embodiments the controller is programmed to lengthen the closed time of the pulsed valve if the gauge pressure is below a programmed pressure and to shorten the closed time of the pulsed valve if the gauge pressure is above the programmed pressure, thereby maintaining the pressure in the process chamber at or near a programmed pressure. The controller may be programmed in certain other embodiments to shorten the open time of the pulsed valve if the gauge pressure is below a programmed pressure and to lengthen the open time of the pulsed valve if the gauge pressure is above the programmed pressure, thereby maintaining the pressure in the process chamber at or near a programmed pressure.

One type of process chamber for which the invention is especially useful is for etching semiconductor wafer substrates under negative pressure wherein HF gas is introduced at an inlet and is removed after processing at an outlet. Other types of process chambers to which this invention applies are used for chemical vapor deposition on semiconductors, and plasma ion implantation. It is preferred that the pulse valve be located at the outlet of such types of process chambers to control the pressure drop between the chamber and the pump. However, any sort of apparatus which needs pressure control in a process chamber which is fed by gas or vapor at a first pressure and wherein the exhaust gas exits the chamber at an outlet at a second, lower pressure, where pressure is controlled by downstream pressure control means, can benefit from the improved pressure control system and method of this invention.

Suitable pulse valves for use in the system of the invention include Swagelok ALD-3 and ALD-6 brand valves, by way of example of commercially available pulsed valves.

BRIEF DESCRIPTION OF THE DRAWINGS

Other objects and advantages of the invention will become apparent upon reading the following detailed description and upon reference to the accompanying drawings in which:

FIG. 1 is a schematic view of an apparatus according to the invention.

DETAILED DESCRIPTION

Referring first to FIG. 1, an embodiment of an apparatus according to the invention is illustrated wherein a gas source 7 feeds a combination of hydrogen fluoride gas, ethanol vapor and nitrogen gas through the inlet tube to the process chamber 6 at a relatively constant gas flow controlled by mass flow controllers (not shown) or other flow control devices.

Process chamber 6 is a corrosion resistant vacuum chamber holding silicon dioxide-containing work to be processed wherein gas is input from a gas source and is removed through an outlet, and where pressure control takes place.

Typical operating pressure for vapor HF etching is from 50 torr to 300 torr. In other fields, a wider range of pressures can be controlled by the system of the invention as long as the pressure difference at the inlet is sufficiently higher than at the output and the pump is capable, and so the invention is not limited to being used for any specific pressure.

Gas source 7 provides a constant flow of feed or process gases. In the illustrated embodiment, the inlet gas flow is typically 0.2 SLM to 4.0 SLM, but other flows, especially other higher flows, can be used in other fields and other applications of the invention. The gas is used in the illustrated embodiment in a chemical reaction in the process chamber which etches silicon dioxide and creates volatile byproducts, SiF4 and $H_2O$.

At the outlet from the process chamber, the exhaust, which includes the un-reacted feed products and the by-products from the chemical reaction, is withdrawn, due to negative pressure provided by pump 4 which is a vacuum pump or other device or system to generate a pressure lower than the incoming source pressure 7. The exhaust gas exits the pump 4 into a scrubber or acid compatible ventilation.

The process chamber is equipped with a pressure measurement device 2, for example a Baratron® capacitive manometer, cold cathode gauge, thermocouple gauge, or the like, which measures the pressure in the process chamber and sends pressure data to a controller 1 which is programmed to send a pulsed output 3 to pulsed valve 5, based on the difference between the measured pressure value and the desired or inputted pressure value, thereby controlling the rate at which the valve is pulsed.

Pulsed Valve 5 is any valve capable of receiving a pulsed signal from the controller 1 which can stop or allow gas flow between process chamber 6 and pump 4.

The pulsed output 3 can be mechanical, electromechanical, electrical, pneumatic, or any method which causes the valve to switch between its open to closed state at a controlled rate. The rate, of course, is varied, depending on whether the actual pressure is above or below the setpoint.

In some embodiments of the invention, controller 1 is programmed to lengthen the closed time of pulsed valve 5 if gauge pressure measurement device 2 indicates a pressure below a programmed pressure and to shorten the closed time of pulsed valve 5 if the gauge pressure measurement device 2 indicates a pressure above the programmed pressure, thereby maintaining the pressure in the process chamber 6 at or near a programmed pressure.

In some other embodiments controller 1 is programmed to shorten the open time of the pulsed valve 5 if the gauge pressure measurement device 2 indicates a pressure below a programmed pressure and to lengthen the open time of pulsed valve 5 if the gauge pressure is above the programmed pressure, thereby maintaining the pressure in the process chamber 6 at or near a programmed pressure.

Alternatively, controller 1 can be programmed to adjust both the open and closed timings of pulsed valve 5 to provide less average conductance between the process chamber 6 and the pump 4 if the gauge pressure is below a programmed pressure and to adjust both the open and closed timings of the pulsed valve to provide more average conductance between the process chamber and the pump 4 if the gauge pressure is above a programmed pressure.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A process chamber apparatus having an inlet for continuous gas inlet flow and an outlet for continuous gas outlet flow, a means for controlling process chamber pressure comprising a pressure gauge, a programmable logic controller, and a pulsed valve at, or in fluid communication with, the outlet, the pulsed valve having a controllable pulse rate, the pulsed valve regulating the process chamber pressure to maintain the pressure in the process chamber based on a programmed pressure, wherein the controller is programmed to process pressure data from the pressure gauge and to vary the pulse rate of the pulsed valve as gas enters the process chamber through the inlet, based on a difference between a measured process chamber pressure and the programmed pressure, to control the process chamber pressure by adjusting the process chamber pressure to the programmed pressure, the process chamber holding the work to be processed.

2. The apparatus of claim 1 wherein the controller is programmed to lengthen the closed time of the pulsed valve if the gauge pressure is below the programmed pressure and to shorten the closed time of the pulsed valve if the gauge pressure is above the programmed pressure, thereby maintaining the pressure in the process chamber based on the programmed pressure.

3. The apparatus of claim 1 wherein the controller is programmed to shorten the open time of the pulsed valve if the gauge pressure is below the programmed pressure and to lengthen the open time of the pulsed valve if the gauge pressure is above the programmed pressure, thereby maintaining the pressure in the process chamber based on the programmed pressure.

4. The apparatus of claim 1 wherein the controller is programmed to adjust both the open and closed timings of the pulsed valve to provide less average conductance between the process chamber and the pump if the gauge pressure is below the programmed pressure and to adjust both the open and closed timings of the pulsed valve to provide more average conductance between the process chamber and the pump if the gauge pressure is above the programmed pressure.

5. The apparatus of claim 1 wherein the gas is HF, ethanol vapor and nitrogen and the process chamber is adapted to etch semiconductor wafers.

6. The apparatus of claim 1 wherein the pressure gauge is selected from a capacitive manometer, a cold cathode gauge, and a thermocouple gauge.

7. The apparatus of claim 1 wherein the apparatus is adapted to maintain the pressure at a value within the range of 50 to 300 Torr.

8. The apparatus of claim 1 wherein the apparatus is adapted to maintain the inlet gas flow at a level of 0.2 to 4.0 SLM.

9. A method of controlling pressure in a process chamber having a continuous gas inlet flow and a continuous gas outlet flow, comprising providing a pulsed valve at a gas outlet, a pressure gauge, and a programmable controller and varying the pulse rate of the pulsed valve as gas enters the process chamber through an inlet, based on a difference between a measured process chamber pressure and a programmed pressure, the pulsed valve regulating the process chamber pressure to maintain the pressure in the process chamber based on the programmed pressure by adjusting the process chamber pressure to the programmed pressure, the process chamber holding the work to be processed.

10. The method of claim 9 comprising programming the controller to lengthen the closed time of the pulsed valve if the gauge pressure is below the programmed pressure and to shorten the closed time of the pulsed valve if the gauge pressure is above the programmed pressure, thereby maintaining the pressure in the process chamber based on the programmed pressure.

11. The method of claim 9 comprising programming the controller to shorten the open time of the pulsed valve if the gauge pressure is below the programmed pressure and to lengthen the open time of the pulsed valve if the gauge pressure is above the programmed pressure, thereby maintaining the pressure in the process chamber based on the programmed pressure.

12. The method of claim 9 comprising programming the controller to adjust both the open and closed timings of the pulsed valve to provide less average conductance between the process chamber and the pump if the gauge pressure is below the programmed pressure and to adjust both the open and closed timings of the pulsed valve to provide more average conductance between the process chamber and the pump if the gauge pressure is above the programmed pressure.

13. The method of claim 9 wherein the gas is HF, ethanol vapor and nitrogen and the process chamber is adapted to etch semiconductor wafers.

14. The method of claim 9 comprising maintaining the pressure at a value within the range of 50 to 300 Torr.

15. The method of claim 9 comprising maintaining the inlet gas flow at a level of 0.2 to 4.0 SLM.

* * * * *